United States Patent [19]  
Martin et al.

[11] Patent Number: 4,571,554  
[45] Date of Patent: Feb. 18, 1986

[54] BALANCED AMPLIFIER DEVICE

[75] Inventors: Hardison G. Martin; Robert Ponto, both of Louisville, Ky.

[73] Assignee: Innovative Electronic Designs, Inc., Louisville, Ky.

[21] Appl. No.: 543,923

[22] Filed: Oct. 20, 1983

Related U.S. Application Data

[63] Continuation-in-part of Ser. No. 283,128, Jul. 14, 1981, abandoned.

[51] Int. Cl.⁴ .............................................. H03F 3/45
[52] U.S. Cl. .................................... 330/252; 330/171; 330/297
[58] Field of Search ............... 330/105, 199, 200, 171, 330/261, 258, 252, 297

[56] References Cited

U.S. PATENT DOCUMENTS 4,320,350 3/1982 Drapac ................................ 330/297

Primary Examiner—James B. Mullins
Assistant Examiner—G. Wan
Attorney, Agent, or Firm—Edward M. Steutermann

[57] ABSTRACT

A signal amplifier device providing output power independent of change in output characteristics or common mode interference including a signal input source to provide an input signal, a first power supply and second power supply having a transformer with a secondary coil and a reference power, first differential amplifier powered by the first power supply to receive the input signal and provide first and second complementary output signals, first and second output amplifiers driven by the reference power supply and each having an input to receive one of the first and second signals and amplify same to provide first and second output signals at the respective outputs so that upon imposition of a transient signal at the output of one of the first and second output amplifiers an isolation network prevent the transient signal from appearing as a differential signal on either output.

8 Claims, 2 Drawing Figures

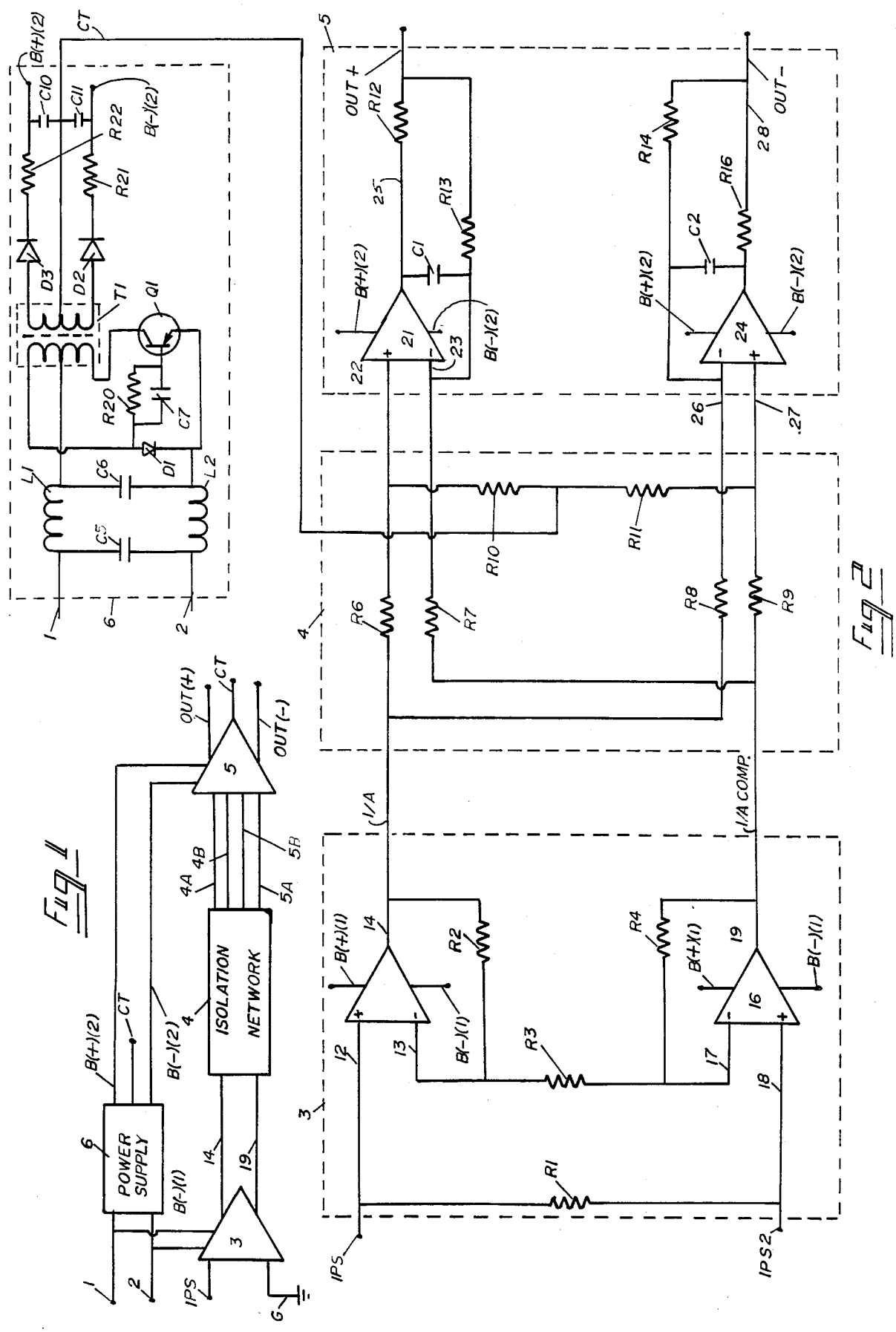

BALANCED AMPLIFIER DEVICE

BACKGROUND OF THE INVENTION

The present application is a continuation in part of our copending application Ser. No. 283,128 filed July 14, 1981 now abandoned, Oct. 20, 1983.

The present invention relates to amplifier systems particularly useful in audio systems. Specifically the present invention relates to the balance audio output transformer arrangement where the transformer is not located directly in the audio chain.

Standard audio interconnection techniques employ transformer coupling at both input and output and require balanced transmission lines for common mode noise immunity. Such systems work very well but for high quality applications but transformer cost is significant. In certain applications conventional audio input transformers have been replaced with differential amplifiers, with varying degrees of success.

The conventional output transformers have generally been replaced with a simple balanced output amplifier which does not provide ground isolation and is capable of creating more problems than eliminated. Such an arrangement is shown in Encyclopedia of Electronic Circuits by Leo G. Sands and Donald R. Mackenroth, published by Parker Publishing Co., Inc. West Nyack, New York © 1975.

Alternatively devices have been having an input transformer associated with output without transformer.

SUMMARY OF THE INVENTION

The present invention provides an audio amplification system including a differential signal input amplifier, and a differential amplifier output amplifier providing two signals which are the result of signal difference between the two inputs. An output is produced only when there is difference in signals at the input to the input amplification stage or the output amplification stage where common mode signals are eliminated or reduced. Devices within the scope of the present invention provide improved frequency response.

More particularly, audio devices within the scope of the present invention provide both a balanced output and at the same time provide ground isolation so that a conventional transformer can be replaced with a totally active circuit. Additionally, the cost of the circuit is reduced by two/thirds to nine/tenths while providing a circuit where the harmonic distortion is only 1/100 as much at low frequencies as in prior art devices utilizing input and output transformers.

Further devices within the scope of the present invention provide no insertion loss and low output impedence.

Additionally, hum pickup is reduced 60 decibels with no shield required and the weight of the units is substantially reduced.

More specifically, the present invention provides an audio signal amplifier device providing common mode rejection and includes a signal amplifier device providing a substantially constant output signal even in the presence of disruptive transient signals including a signal amplifier device providing output power independent of change in output charcteristics or common mode interference including a signal input source to provide an input signal, a first power supply and second power supply having a transformer with a secondary coil and a reference power, first differential amplifier powered by the first power supply to receive the input signal and provide first and second complementary output signals, first and second output amplifiers driven by the reference power supply and each having an input to receive one of the first and second signals and amplify same to provide first and second output signals at the respective outputs so that upon imposition of a transient signal at the output of one of the first and second output amplifiers an isolation network prevent the transient signal from appearing as a differential signal on either output.

One example of an arrangement within the scope of the present invention is disclosed hereinafter with reference to the accompanying figures but it will be recognized that other arrangements also within the scope of the present invention will occur to those skilled in the art upon reading the disclosure set forth hereinafter.

BRIEF DESCRIPTION OF THE DRAWINGS

One example in accordance with the present invention is disclosed in the accompanying drawings wherein:

FIG. 1 is a brief schematic of a circuit within the scope of the present invention; and FIG. 2 is a detailed schematic in accordance with an arrangement shown in FIG. 1.

DETAILED DESCRIPTION OF THE DRAWINGS

Referring first to FIG. 1, which shows an example of a system within the scope of the present invention, a power supply 6, for example a conventional flyback switching supply with 1:1 voltage conversion is provided and supplied power B(+)(−) at terminals 1,2 and likewise supplies postive output source voltage B(+)(2) and negative output source voltage B(−)(2), as shown in more detail in FIG. 2, but also illustrated in FIG. 1. A center tap CT is provided from transformer T1.

The B(+)(1) and B(−)(1) source voltage is supplied, as shown, to differential input amplifier 3 which has one terminal grounded at G and also receives input signal IPS, for example from an audio source. Outputs 14,19 from differential amplifier 3 are supplied to an isolation network 4 to provide ground isolation as described hereinafter. The isolation network is a passive network to provide a balanced signal independant of externally applied voltage. For example a power supply 6 or power source B(−)(1) B(+)(1) can be provided. Also, if the isolation is sufficient no ground loop will be formed.

Outputs 4A, 4B and 5A, 5B from isolation network 4 are supplied to a dual differential output amplifier 5 which provides differential output signals out(+) and out(−), as well as a center tap connection CT to an isolation network 4 as a reference. The center tap CT references the power system to the isolation network and output amplifiers 21 and 24.

FIG. 2 is a more detailed schematic of an example within the scope of the present invention and shows two inputs IPS and IPS 2 where as shown in FIG. 1 IPS 2 can be grounded and a single ended audio signal applied at input IPS.

A bias resistor R1 can be provided in parallel between IPS and IPS 2. Additionally, as shown, input IPS is connected to the noninverting input 12 of an amplifier 11 while the input IPS2 is provided to the noninverting input 18 of a second amplifier 16. Amplifiers 11 and 16 are connected in differential amplifying mode. The inverting inputs 13 and 17 of amplifiers 11 and 16 are connected as shown, through a series resistor R3 and feedback loops. Resistors R2 and R4 respectively, are provided to outputs 14 and 19 of amplifiers 11 and 16. In this regard it has been found that if resistor R2 is one half the value of resistor R4 then a current Io flows through the feedback loops and the resulting gain of such an arrangement is 4 or for a proper preferred operation a multiple of 2. The voltage at output 14 is for example VA while the voltage at output 19 is the complement or VA (comp.) times the voltage of the input signal IPS. Also, differential amplifier 3 is supplied power from B(−)(1), B(+)(1).

In one example in accordance with the present invention the input amplifiers were type LF353N operational amplifiers, resistor R2 had a value of 10K ohms, and resistor R4 had a value of 20K ohms, and resistor R1 had a value of 1 MEG. ohm. In this case resistor R3 had a value of 10K ohms.

Under these conditions the differential voltage between outputs 14 and 19 if amplers 11 and 16 was 4 times the voltage at IPS. The isolation network 4 simply includes resistors R6 and R8 in series with output 14 where resistor R6 is connected to noninverting input 22 of an amplifier 21, for example a type LF353N or NE5532 operational amplifier in the differential output section and resistor R8 supplies a signal to the inverting input of a second similar operational amplifier 24. Resistors R7 and R9 are in series with output 19 of amplifier 16 of differential input amplification stage 3 where resistor R9 is in series with the noninverting input 27 of amplifier 24 and resistor R7 is in series with the inverting input 23 of amplifier 21 Amplifiers 21 and 24 are connected as a differential amplifier section and are supplied power from B(+)(2) and B(−)(2) where the voltage difference between B(+)(2) and B(−)(2) is generally fixed but the absolute value of the voltage referred to ground floats in response to common mode output transient voltage or impedance as discussed hereinafter. In accordance with one feature of the present invention the isolation network 4 can determine the gain achieved in the output differential amplification section 5. The differential gain provided by the isolation network and output section 5 will be in the ratio of 2.5/3.0., an overall gain of 10/3 has been found to be particularly useful.

In the arrangement shown in FIG. 2, each amplifier 11 and 16 of the differential input section sees the same high load impedance so each provides common mode rejection, and provides an output balance around center tap CT. Each of the amplifiers 21, 24 includes an RC filter circuit, and in the case of amplifier 21 includes capacitor C1 and resistor R13 and in the case of amplifier 24 includes capacitor C2 and resistor R14. Resistors R12 and R16 are provided in series with outputs 25 and 28 respectively, of amplifiers 21 and 24. In this case in one example resistors R12 and 16 have a value of 10 ohms while resistors R13 and R14 have a value of 10K ohms. Capacitors C1 and C2 had values of 33 pf.

In accordance with the present invention the input of each of the amplifiers 21,24 is inter-connected through series resistors R10 and R11, each having a value of 10K ohm and a reference signal CT is provided between resistors R10 and R11 to provide a feedback loop to amplifiers 21 and 24. In this case the reference input CT is the center tap CT of transformer T1 which also supplies output source voltage B(+)(2) and B(−)(2) to amplifiers 21 and 24.

The R13-C1, R14-C2 feedback loops prevent uncontrolled swing in the output 25 and 28 from amplifiers 21 and 24 under conditions of output overload.

The reference input CT, which controls the operation of amplifiers 21 and 24, similar to a feedback loop, also dramatically and unexpectedly improves the operating characteristics of the overall system. Accordingly, because of the balance of the system, if one of the outputs 25 or out(+) or the output 28 out(−) is loaded then the CT input drives the other amplifier due to power pulled from the power supply B (+) (2), which is connected to CT, which is not loaded and the power supply swings much above the reference voltage. More particularly it has been found that while the B(+)(2) and B(−)(2) output differential may remain generally at, for example 15 volts, the absolute value of the applied voltage above ground reference may go as high as 45 volts limited only by the isolation network 4 characteristics thus greatly inhancing the output capabilities of the unit. The B(+)(2) and B(−)(2) and the center tap CT are supplied from power supply 6 as shown from power supply 1, 2 for example which includes inductors L1, L2 coupled through capacitors C5, C6 and a circuit D1, R20 and C7 to a PNP transistor Q1 with capacitor C7 and resistor R20 in parallel to the base thereof to the primary coil of a transformer T1, the secondary of transformer T1 is connected through filter and rectifier circuits D2, D3, L21, L22 and capacitors C10, C11 to outputs B(+)(2) and B(−)(2) while the center tap from the secondary coil provides the center tap CT to the isolation network 4.

It will be understood that the foregoing is but one arrangement within the scope of the present invention and that other arrangements also within the scope of the present invention will occur to those skilled in the art upon revealing the disclosure set forth hereinbefore.

The invention claimed is:

1. A signal amplifier providing output power in response to change in output impedance including audio signal input source means to provide an input signal; a first power supply means to receive power from a power supply source and having a transformer with a secondary coil and a reference output from the secondary coil, to supply a reference signal; first and second amplifier means connected as a differential amplifier pair each having signal input means wherein at least one of said first and second amplifier means receives a portion of said input signal and where said first and second amplifier means are powered by said power supply source and each includes signal output means to provide complementary first and second balanced signals, first and second output amplifiers connected as a parallel differential amplifier pair each having a signal output means and signal input means to receive one of said complimentary first and second balanced signals and amplify same to provide first and second outputs signals respectively where said first and second output amplifiers power from said first power supply and receive said reference signals from said reference output so that the power supplied to the first and second output amplifiers changes upon change in impedance at one of said first and second amplifier signal outputs.

2. The invention of claim 1 wherein said first and second amplifier means each includes signal feedback means to cause said first and second complementary signals to be complementarily balanced.

3. The invention of claim 1 including impedance means between said signal output means of said first amplifier means and said signal input means of said second output amplifier wherein said impedance means is sufficient to prevent ground interference.

4. The invention of claim 1 wherein said reference output from said transformer is a center tap of said secondary coil.

5. The invention of claim 1 wherein said first and second amplifier means input means include signal inverting and noninverting input means and wherein said signal inverting input means of said first and second amplifier means are connected and said reference signal is provided to at least one of said first and second signal non inverting input means.

6. The invention of claim 5 wherein the other of said first and second signal non inverting input means is connected to a constant voltage reference.

7. The invention of claim 1 wherein said first and second output amplifier means signal input means include signal inverting input and signal noninverting input and where said first complementary signal is supplied to the signal noninverting input means of said first output amplifier and to the signal inverting input of the second output amplifier, where the second complementary signal is supplied to the signal inverting input of said second output amplifier and to the signal noninverting input of the second output amplifier.

8. The invention of claim 7 wherein said reference signal is supplied to the noninverting inputs of said first and second output amplifier means.

* * * * *